(12) United States Patent
Yasukawa et al.

(10) Patent No.: US 7,211,829 B2
(45) Date of Patent: May 1, 2007

(54) SEMICONDUCTOR PHOTODETECTOR DEVICE

(75) Inventors: Hisatada Yasukawa, Kyoto (JP);
Ryouichi Ito, Kyoto (JP); Takaki Iwai,
Osaka (JP); Masaki Taniguchi, Hyogo
(JP); Yasushi Jin, Osaka (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 182 days.

(21) Appl. No.: 11/059,500

(22) Filed: Feb. 17, 2005

(65) Prior Publication Data

US 2005/0189546 A1    Sep. 1, 2005

(30) Foreign Application Priority Data

Mar. 1, 2004 (JP) ............................. 2004-056681
Oct. 25, 2004 (JP) ............................. 2004-309537

(51) Int. Cl.
*H01L 27/15* (2006.01)
*H01L 31/113* (2006.01)

(52) U.S. Cl. ..................... 257/79; 257/290; 257/291; 257/292; 257/293

(58) Field of Classification Search .............. 257/79, 257/290, 291, 292, 293
See application file for complete search history.

(56) References Cited

U.S. PATENT DOCUMENTS

| 4,879,470 A * | 11/1989 | Sugawa et al. ............. 250/208.1 |
| 5,204,544 A * | 4/1993 | Inoue et al. ................ 257/462 |
| 2003/0143786 A1 * | 7/2003 | Thomas et al. ............. 438/151 |

FOREIGN PATENT DOCUMENTS

| JP | 56-60054 A | 5/1981 |
| JP | 5-275669 A | 10/1993 |
| JP | 9-219534 A | 8/1997 |
| JP | 11-233806 A | 8/1999 |

* cited by examiner

*Primary Examiner*—Long K. Tran
(74) *Attorney, Agent, or Firm*—McDermott Will & Emery LLP

(57) ABSTRACT

A semiconductor photodetector device includes: a first semiconductor layer of a first conductivity type; and a second semiconductor layer of a second conductivity type formed on the first semiconductor layer and having a light-receiving region. The first semiconductor layer includes a first region containing an impurity of the first conductivity type at a high concentration and a second region formed on the first region and containing an impurity of the first conductivity type at a concentration lower than that of the first region. The second semiconductor layer includes a third region containing an impurity of the second conductivity type at a concentration higher than that of the second region and a fourth region formed on the third region and containing an impurity of the second conductivity type at a concentration higher than that of the third region.

11 Claims, 11 Drawing Sheets

SEMICONDUCTOR PHOTODETECTOR DEVICE

CROSS-REFERENCE TO RELATED APPLICATION

The disclosures of Japanese Patent Applications Nos. 2004-56681 and 2004-309537 filed on Mar. 1, 2004 and Oct. 25, 2004, respectively, including claims, specifications, drawings and claims are incorporated herein by reference in their entirety.

BACKGROUND OF THE INVENTION

The present invention relates to semiconductor photodetector devices, and particularly to a semiconductor photodetector device in which a photodetector and a logic element are formed on the same substrate.

Opto-electronic integrated circuit (OEIC) devices in each of which a photodetector such as a photodiode converting a light signal into an electric signal and a logic element such as a transistor and a capacitor constituting a peripheral circuit are formed on a substrate are known to date as semiconductor photodetector devices, and have been used as optical pickup devices for compact discs (CDs) or digital versatile discs (DVDs), for example.

Hereinafter, an OEIC device including a transistor and a photodiode will be described as a first conventional example.

FIG. 6 shows a cross-sectional structure of an OEIC device according to the first conventional example. As shown in FIG. 6, in the OEIC device of the first conventional example, an n-type semiconductor layer 202 with a low impurity concentration and a thickness of about 4.4 μm is epitaxially grown on a substrate 201 of silicon containing a p-type impurity at a low concentration. In the substrate 201 and the n-type semiconductor layer 202, an isolation region 203 is formed as a p-type buried region with a high impurity concentration, thereby defining a region where an npn-bipolar transistor 20 is formed and a region where a photodiode 40 is formed. On the n-type semiconductor layer 202, an insulating layer 204 having contact holes for making contacts with electrodes of the bipolar transistor 20 and the photodiode 40 is formed.

The bipolar transistor 20 includes: a collector-lower-part extraction region 221 that is a high-concentration n-type buried region formed between the substrate 201 and the n-type semiconductor layer 202; a collector region 222 formed by diffusing an n-type impurity in the n-type semiconductor layer 202; a base region 223 formed by selectively diffusing a p-type impurity in the collector region 222; an emitter region 224 and a base contact region 225 formed by selectively diffusing an n-type impurity with a high concentration and a p-type impurity with a high concentration, respectively, in the base region 223; and a collector-upper-part extraction region 226 and a collector contact region 227 formed by diffusing a p-type impurity in respective parts of the n-type semiconductor layer 202 at a side of the base region 223. In the bipolar transistor 20, the emitter region 224, the base contact region 225 and the collector contact region 227 are connected to an emitter electrode 228, a base electrode 229 and a collector electrode 230, respectively, via contact holes formed in the insulating layer 204.

The photodiode 40 includes: a cathode region 241 that is a high-concentration n-type buried region formed between the substrate 201 of p-type silicon and the n-type semiconductor layer 202; an anode region 242 formed by diffusing a p-type impurity with a high concentration in the n-type semiconductor layer 202; a cathode extraction region 243 and a cathode contact region 244 formed by diffusing an n-type impurity with a high concentration in respective parts of the n-type semiconductor layer 202 at a side of the anode region 242. In the photodiode 40, the anode region 242 and the cathode contact region 244 are connected to an anode electrode 245 and a cathode electrode 246, respectively, via contact holes formed in the insulating layer 204.

In the OEIC device of the first conventional example, when a reverse bias voltage is applied across the anode electrode 245 and the cathode electrode 246, a depletion layer is formed at the pn junction between the high-concentration anode region 242 and the low-concentration n-type semiconductor layer 202. This depletion layer is formed predominantly in the low-concentration n-type semiconductor layer 202. A depletion layer is also formed at the pn junction between the high-concentration cathode region 241 and the low-concentration substrate 201 in the same manner. In these two depletion layers, carriers are generated from incident light entering from the upper face of the photodiode 40, thereby generating photoelectric current. The amount of this photoelectric current increases in proportion to the amount of incident light absorbed in the n-type semiconductor layer 202. The amount of absorbed incident light depends on the distance in which the incident light travels from the surface of the semiconductor substrate toward the inside. The amount of absorbed incident light is represented as $1-\exp(-\alpha t)$ where t is the depth from the surface and $\alpha$ is the absorption coefficient of the incident light. The depletion layer extending from the high-concentration cathode region 241 to the low-concentration substrate 201 is useful in capturing carriers generated from incident light deeply entering the inside across the cathode region 241 and effectively increases light sensitivity to laser light with a relatively long wavelength (e.g., infrared laser light at about 780 nm.) However, carriers that have reached a deep part of the substrate 201 are added as a part of photoelectric current, so that these carriers are diffused and move in the substrate 201 for a longer time. This causes deterioration of high-frequency characteristics of the photodetector.

As a second conventional example, as shown in FIG. 7, an OEIC device in which a first p-type semiconductor layer 251 containing an impurity at a high concentration and a second p-type semiconductor layer 252 containing an impurity at a low concentration are formed between a substrate 201 and an n-type semiconductor layer 202 has been developed.

In the OEIC device of the second conventional example, carriers generated from incident light reaching a portion deeper than the first p-type semiconductor layer 251 are absorbed in the first p-type semiconductor layer 251 containing the high-concentration impurity and do not reach a cathode region 241, so that the frequency response characteristic of a photodetector is not lost. On the other hand, in a depletion layer formed in the second p-type semiconductor layer 252 between the cathode region 241 and the first p-type semiconductor layer 251, carriers generated from strong incident light which is hardly attenuated are captured as photoelectric current, so that the device of the second conventional example hardly losses light sensitivity, thus enhancing frequency characteristics as compared to the device of the first conventional example.

In recent years, in the case of applying such an OEIC device to an optical pickup device, higher light sensitivity of the photodiode 40 and enhancement of operating speeds and frequency characteristics of the bipolar transistor 20 and the photodiode 40 have been demanded. As a light source for an optical pickup device, laser light with a wavelength of about 780 nm and a laser light with a wavelength of about 650 nm are used for CDs and DVDs, respectively, for example. In more recent days, to increase recording density, light sensitivity to blue light with a wavelength of about 410 nm is also demanded, as described above.

However, in each of the OEIC devices of the first and second conventional examples, the n-type semiconductor layer 202 serves as an active region and the collector region 222 located in an upper part of the n-type semiconductor layer 202 serves as an active region of the bipolar transistor 20. Accordingly, if the thickness of the n-type semiconductor layer 202, for example, is increased to 5 µm or more, the light sensitivity of the photodiode 40 increases but the thickness of the collector region 222 increases as the thickness of the n-type semiconductor layer 202 increases. As a result, there arises a problem in which high-frequency characteristics of the bipolar transistor 20 are impaired. In view of this, if priority is given on improvement of high-frequency characteristics of the bipolar transistor 20 and the thickness of the n-type semiconductor layer 202 is reduced to 1 µm or less, parasitic capacitance due to isolation of the bipolar transistor 20 decreases, so that the high-frequency characteristics of the bipolar transistor 20 are improved but the light sensitivity of the photodiode 40 decreases.

In the photodiode 40 of each of the first and second conventional examples, carriers generated from incident light are captured in the depletion layer at the pn junction between the p-type anode region 242 and the n-type semiconductor layer 202 and the depletion layer at the pn junction between the n-type cathode region 241 and the p-type substrate 201, so that junction capacitances of these pn junctions increase, and a transfer characteristic (gain) at high frequencies is not ensured. In the second conventional example, the high-frequency characteristics are improved by the presence of the first p-type semiconductor layer 251 as compared to the first conventional example. However, the influence of the junction capacitances of the pn junctions prevents sufficient improvement of the high-frequency characteristics even in the second conventional example. In addition, the photodiode 40 and the bipolar transistor 20 of each of the first and second conventional examples are isolated such that the n-type semiconductor layer 202 and the collector region 222 serving as their active regions are surrounded by the isolation region 203 including the pn junctions. Accordingly, the pn junction capacitances due to the isolation are added to these elements, so that a cause of deterioration of high-frequency characteristics arises.

The percentage of absorption of blue light is about 60% in the portion from the surface to a depth of about 0.2 µm and decreases in a deeper portion as the amount of incident light which has reached the portion (i.e., the amount of absorbed light) increases. In the first and second conventional examples, the high-concentration p-type base region 223 and the high-concentration p-type anode region 242 are generally formed by the same diffusion process to share the diffusion process, so that the diffusion depth for the base region 223 and the anode region 242 is about 0.6 µm. The depletion layer formed at the pn junction between the high-concentration p-type anode region 242 and the low-concentration n-type semiconductor layer 202 is also present in the anode region 242 and extends toward the surface of the anode region 242. However, this distance is about 0.2 µm at most. Accordingly, in the structures of photodetectors of the first and second conventional examples, light is received at a position at which the amount of absorbed blue light is small, so that sufficient light sensitivity to blue light is unlikely to be obtained.

In view of this, the thickness of the anode region 242 needs to be smaller than 0.2 µm so as to cause carriers to be generated from incident light in a region where the light-conversion efficiency is high. However, in the OEIC devices of the first and second conventional examples, if the thickness of the anode region 242 is reduced, a sufficient depletion layer is not formed in the n-type semiconductor layer 202, so that it is difficult to enhance light sensitivity to light with a short wavelength.

In addition, an OEIC device used in a recent optical pickup device needs to not only maintain previously-achieved light sensitivity and high-speed response to infrared light and red light but also satisfy light sensitivity and high-speed response to blue light at the same time.

Hereinafter, an OEIC device in which a photodiode and a bipolar transistor are formed in a monolithic manner will be described as a third conventional example (see, for example, Japanese Unexamined Patent Publication (Kokai) No. 9-219534.)

FIG. 8 shows a cross-sectional structure of an OEIC device in which an npn-transistor serving as a bipolar transistor and a photodiode of an anode common type are formed on the same substrate.

As shown in FIG. 8, a $p^+$-type semiconductor region 302 of a high-concentration semiconductor layer is formed on a semiconductor substrate 301 having a specific resistance of 150 $\Omega$cm and made of p-type silicon (Si) with a low impurity concentration. On the $p^+$-type semiconductor region 302, a $p^-$-type semiconductor region 303 having an impurity concentration lower than that of the $p^+$-type semiconductor region 302 is formed. On the $p^-$-type semiconductor region 303, an n-type semiconductor region 304 having an impurity concentration higher than that of the $p^-$-type semiconductor region 303 is formed.

The peak of the impurity concentration in the $p^+$-type semiconductor region 302 is set at a depth of about 10 µm from the upper face of the n-type semiconductor region 304. The thickness of the n-type semiconductor region 304 is set equal to or smaller than that of an isolation insulating layer 305. For example, if the thickness of the isolation insulating layer 305 is 1 µm, the thickness of the n-type semiconductor region 304 is set at 1 µm or less.

A photodetector part 100 and a transistor part 200 are defined in the $p^-$-type semiconductor region 303 and the n-type semiconductor region 304. An $n^+$-type semiconductor region 306 having an impurity concentration higher than that of the n-type semiconductor region 304 is formed in the uppermost part of the n-type semiconductor region 304 in the photodetector part 100. In this case, the thickness of the $n^+$-type semiconductor region 306 is 0.15 µm or less.

A cathode of the photodetector part 100 is constituted by: a cathode contact region 307 formed in the periphery of the $n^+$-type semiconductor region 306; an n-type polycrystalline semiconductor layer 308; and a cathode electrode 309. An anode of the photodetector part 100 is constituted by: a $p^+$-type buried region 310 formed in the periphery of the photodetector part 100; an anode contact region 311; a p-type polycrystalline semiconductor layer 312; and an anode electrode 313.

On the other hand, the transistor part 200 made of an npn-bipolar transistor is formed in the n-type semiconductor region 304 and isolated by the isolation insulating layer 305 and the $p^+$-type buried region 310. A collector of the transistor part 200 is constituted by: a buried collector region 314; a collector contact region 315; the n-type polycrystalline semiconductor layer 308; and a collector electrode 316. A base is constituted by: an active base region 317; a contact base region 318; the p-type polycrystalline semiconductor layer 312; and a base electrode 320. An emitter is constituted by: an emitter region 319; the n-type polycrystalline semiconductor layer 308; and an emitter electrode 321.

Operation of the conventional semiconductor device configured in the manner described above will be described with reference to FIGS. 8, 9A and 9B.

First, the surface of the $n^+$-type semiconductor region 306 is irradiated with light incident on the photodetector part 100. As shown in FIGS. 9A and 9B, carriers generated in the $n^+$-type semiconductor region 306 and the n-type semiconductor region 304 are accelerated by a potential gradient a formed by the concentration difference between the n-type semiconductor region 304 and the $n^+$-type semiconductor region 306 to move from the $n^+$-type semiconductor region 306 to a flat region c of the n-type semiconductor region 304 without disappearing due to recombination. These carriers reach the $p^-$-type semiconductor region 303. In the $p^-$-type semiconductor region 303, a reverse bias voltage is previously applied to the cathode electrode 309 of the photodetector part 100, so that a depletion layer is formed in a region extending from the $p^-$-type semiconductor region 303 surrounded by the $p^+$-type buried region 310 in the periphery of the photodetector part 100 to the $p^+$-type semiconductor region 302. Accordingly, the carriers that have reached the $p^-$-type semiconductor region 303 move in the depletion layer at high speed as drift current, thus enabling high-speed response of the photodetector part 100.

Incident light which has reached the semiconductor substrate 301 is converted into carriers in the semiconductor substrate 301 and these carriers move freely by diffusion. The speed of this movement is slow because this movement is caused by diffusion, and the carriers partly disappear by recombination. Carriers which do not disappear by recombination reach a portion near the $p^+$-type semiconductor region 302. However, these carriers do not reach the $p^+$-type semiconductor region 302 and the $p^-$-type semiconductor region 303 contributing generation of current because of the presence of a potential barrier formed by the impurity-concentration difference between the $p^+$-type semiconductor region 302 and the semiconductor substrate 301, and recombine together to disappear. Accordingly, it is possible to have carriers moving by diffusion disappear, thus enabling a higher response speed.

However, the third conventional example has a problem in which the n-type semiconductor region 304 has a small thickness of 1 μm or less, so that a vertical pnp-transistor (VPNP-Tr) exhibiting high-speed response is not formed. Accordingly, a transistor of an OEIC device is limited to an npn-transistor. This is because, as shown in FIG. 8, if the type of the buried collector region 314, which is "n" in the case of an npn-bipolar transistor constituting the transistor part 200, is to be changed to "p", it is necessary to provide an n-type buried layer for separation between the buried collector region 314 and the $p^-$-type semiconductor region 303.

FIG. 10 shows an OEIC device in which a VPNP-Tr is formed in the device of the third conventional example, as a reference example for solving the problem arising in the third conventional example. As shown in the cross-sectional structure in FIG. 10, in this reference example, the VPNP-Tr is formed as a second transistor part 220. In this example, an n-type buried layer 330 is formed in part of the $p^-$-type semiconductor region 303 in the second transistor part 220 and a p-type buried collector region 331 is formed in an n-type semiconductor region 304 formed on the $p^-$-type semiconductor region 303. The thickness of the n-type semiconductor region 304 is set at about 2 μm so as to form the p-type buried collector region 331 as intended.

A collector of the second transistor part 220 is constituted by: the p-type buried collector region 331; a collector contact region 332; an n-type polycrystalline semiconductor layer 308; and a collector electrode 333. A base is constituted by: an active base region 334; a contact base region 335; a p-type polycrystalline semiconductor layer 312; and a base electrode 336. An emitter is constituted by: an emitter region 337; the n-type polycrystalline semiconductor layer 308; and an emitter electrode 338. In this manner, the structure shown in FIG. 10 makes it possible to form a VPNP-Tr as the second transistor part 220.

As described above, an optical pickup device has three types including a type for high-density DVDs using blue light as well as a type for CDs using infrared light and a type for DVDs using red light, and needs to have sufficient light sensitivity and high-speed response to blue light. For example, the depth from the incident light face at which the amount of light absorbed in silicon semiconductor is about 90% is about 24 μm in the case of infrared light with a wavelength of 780 nm, is about 7.7 μm in the case of red light with a wavelength of 650 nm and is about 0.6 μm in the case of blue light with a wavelength of 407 nm. With respect to characteristics of a photodetector device, a structure in which carriers contributing generation of photoelectric current are effectively extracted as a light absorption amount depending on the wavelength of light enables enhancement of light sensitivity and response speed.

On the other hand, in a logic element part, a VPNP-Tr exhibiting high-speed response needs to be provided because of an increased operating frequency of a semiconductor integrated circuit.

However, in the OEIC device of the third conventional example, in the case of receiving blue light, the thickness of the n-type semiconductor region 304 is 1 μm or less, so that it is difficult to define a region where the p-type buried collector region 331 in the VPNP-Tr in the n-type semiconductor region 304 as intended.

In the reference example shown in FIG. 10, if the thickness of the n-type semiconductor region 304 is 1 μm or more, a flat region d where the potential gradient to electrons is flat becomes dominant as shown in FIG. 11B, so that the traveling distance in which carriers move in the flat region d is long. Accordingly, the time required for carriers to reach a depletion layer formed between the $p^-$-type semiconductor region 303 and the n-type semiconductor region 304 is long, so that the response speed decreases. As the traveling distance of carriers increases, the amount of recombination increases, so that light sensitivity decreases.

Accordingly, as understood from the structures of the third conventional example and the reference example, the mounting of a VPNP-Tr and operation characteristics of a photodetector have a trade-off relationship.

As another problem, as shown in FIG. 9B, frequency characteristics of the photodetector part 100 deteriorate because the resistance value due to series resistance resulting from a low concentration layer e formed between the $p^+$-type buried region 310 and the $p^+$-type semiconductor region 302 is high in the $p^-$-type semiconductor region 303 of the semiconductor photodetector device of the third conventional example. In this conventional example, to reduce this series resistance, a pattern is formed in such a manner that the $p^+$-type buried region 310 is relatively wide.

However, this enlarges a peripheral region of the photodetector part 100, and a problem in which the chip area cannot be reduced arises.

SUMMARY OF THE INVENTION

It is therefore a first object of the present invention to enable both enhancement of high-frequency characteristics and light sensitivity of a photodetector and reduction of parasitic capacitance without deterioration of high-frequency characteristics of a bipolar transistor. A second object of the present invention is to mount an npn-transistor and a vertical pnp-transistor with operation characteristics (i.e., light sensitivity and high-speed response) of a photodetector part maintained.

To achieve the first object, according to the present invention, a semiconductor photodetector device uses a first semiconductor region of a first conductivity type having a low specific resistance, a second semiconductor region of the first conductivity type having a high specific resistance and a third semiconductor region of a second conductivity type having a high specific resistance. The second semiconductor region is provided between the first semiconductor region and the third semiconductor region to be used as an active layer of a photodetector.

To achieve the second object, in a semiconductor layer formed at the surface (light-receiving face) where a light-receiving region is formed, a semiconductor region having an impurity concentration higher than that of the semiconductor layer is formed.

Specifically, a first semiconductor photodetector device according to the present invention achieves the first object and includes: a first semiconductor layer of a first conductivity type; and a second semiconductor layer (an n-type semiconductor layer) of a second conductivity type formed on the first semiconductor layer and having a light-receiving region, wherein the first semiconductor layer includes, under a light-receiving face, a first region (a first p-type semiconductor layer) containing an impurity of the first conductivity type at a high concentration and a second region (a second p-type semiconductor layer) formed on the first region and containing an impurity of the first conductivity type at a concentration lower than that of the first region, and the second semiconductor layer includes a third region (a cathode region) containing an impurity of the second conductivity type at a concentration higher than that of the second region and a fourth region (a high-concentration cathode region) formed on the third region and containing an impurity of the second conductivity type at a concentration higher than that of the third region.

In the first semiconductor photodetector device, the second region of the first semiconductor layer is used as an active region of a photodetector and, in addition, the second semiconductor layer is used as an active region of a bipolar transistor. This structure includes only one pn junction formed between the third region of the second semiconductor layer and the second region of the first semiconductor layer. Red light and infrared light are mainly received by a depletion layer formed in the second region of the first semiconductor layer. Accordingly, the thickness of the second region is secured so that a sufficient depletion region is formed in a photodetector, thus enhancing light sensitivity. In the second semiconductor layer located in a surface part of the light-receiving face, an internal electric field is generated because of the difference in impurity concentration between the third and forth regions of the same conductivity type. This internal electric field is utilized to obtain photoelectric current from carriers generated from incident light. Accordingly, light is not received only in the depletion layer as in conventional examples, but is received by utilizing the internal electric field. As a result, light sensitivity is higher than those in the conventional examples. In addition, one pn junction is used for light reception, so that parasitic capacitance is reduced and thus high-frequency characteristics of the photodetector are improved.

In the first semiconductor photodetector device, the light-receiving region is preferably formed in a given part of the second semiconductor layer surrounded by an isolation insulating film.

Then, the third and fourth regions of the second semiconductor layer are electrically insulated at their sides by the isolation insulating film, so that the position of the pn junction is determined at the lower face of the third region of the second semiconductor layer. Accordingly, parasitic capacitance of the photodetector is reduced to the minimum, thereby improving high-frequency characteristics of the photodetector.

In the first semiconductor photodetector device, an isolation region containing an impurity of the first conductivity type at a high concentration is preferably formed to surround the isolation insulating film surrounding the light-receiving region, and a substrate potential is preferably applied to the isolation region.

Then, parasitic resistance added to the photodetector as an equivalent element is reduced, thus improving high-frequency characteristics of the photodetector.

In the first semiconductor photodetector device, the fourth region preferably has a thickness of 0.01 μm to 0.15 μm, both inclusive.

Then, carriers generated from incident light with a short wavelength such as blue light are effectively captured to be used as photoelectric current.

In the first semiconductor photodetector device, the fourth region preferably contains an impurity of the second conductivity type at a concentration equal to or higher than $10^2$ times that of the third region.

Then, the internal electric field generated between the third and fourth regions is increased to enhance light sensitivity to incident light with a short wavelength and, in addition, the distance of the depletion layer formed in the second region is increased to enhance light sensitivity to incident light with a long wavelength.

In the first semiconductor photodetector device, in the first semiconductor layer, the first region is preferably formed such that the distance from the light-receiving face is longer than the absorption edge of incident light.

Then, absorption of incident light in the first region is ensured, so that photoelectric current is extremely effectively obtained.

In the first semiconductor photodetector device, the first semiconductor layer is preferably formed on a substrate of the first conductivity type, and the first region preferably contains the impurity of the first conductivity type at a concentration equal to or higher than $10^3$ times that of the substrate.

Then, absorption of incident light in the first region is ensured, so that photoelectric current is extremely effectively obtained.

A second semiconductor photodetector device according to the present invention achieves the first object and includes: a first semiconductor layer of a first conductivity type; a second semiconductor layer of a second conductivity type formed on the first semiconductor layer; and an isolation insulating film formed to extend from a surface of the second semiconductor layer to the first semiconductor layer and used to define a light-receiving region and a transistor region in respective parts of the second semiconductor layer, wherein the first semiconductor layer includes, in the light-receiving region, a first region containing an impurity of the first conductivity type at a high concentration and a second region formed on the first region and containing an impurity of the first conductivity type at a concentration lower than that of the first region, and the second semiconductor layer includes, in the light-receiving region, a third region containing an impurity of the second conductivity type at a concentration higher than that of the second region and a fourth region formed on the third region and containing an impurity of the second conductivity type at a concentration higher than that of the third region.

In the second semiconductor photodetector device, the second region of the first semiconductor layer is used as an active region of a photodetector and, in addition, the second semiconductor layer is used as an active region of a bipolar transistor. This allows the structures of the photodetector and the bipolar transistor to be individually optimized. In the bipolar transistor, the side of the transistor region is electrically insulated by the isolation insulating film, so that parasitic capacitance to the substrate is reduced and thereby high-frequency characteristics of the bipolar transistor are improved. In the photodetector, the second region of the first semiconductor layer is made thick to increase light sensitivity to incident light. In addition, light reception is performed by utilizing only one pn junction, so that parasitic capacitance is reduced and thereby high-frequency characteristics of the photodetector are improved. Moreover, even in optimizing the structure of the photodetector in this manner, characteristics of the bipolar transistor are not adversely affected.

In the second semiconductor photodetector device, the second semiconductor layer preferably serves as a collector region in the transistor region, and the transistor region preferably includes: a base region of the first conductivity type formed in a surface layer of the collector region; and an emitter region of the second conductivity type formed in the base region.

In the second semiconductor photodetector device, a buried region of the second conductivity type with a high concentration is preferably formed in a bottom part of the second semiconductor layer in the transistor region, and the semiconductor layer constituting the first region of the first semiconductor layer in the light-receiving region is preferably formed in a lower-layer part apart from the bottom of the buried region of the second conductivity type in the transistor region.

Then, the buried region of the second conductivity type is isolated from peripheral elements by the pn junction between the buried region of the second conductivity type and the second region of the first semiconductor layer with a low impurity concentration. Accordingly, a bipolar transistor with a small parasitic capacitance to the substrate and excellent high-frequency characteristics is implemented. In addition, the semiconductor layer constituting the first region is located in the lower-layer part, so that the substrate resistance is reduced to suppress occurrence of noise resulting from current leaking into the substrate. Accordingly, an OEIC device with an excellent S/N ratio is obtained.

In the second semiconductor photodetector device, the first region of the first semiconductor layer is preferably formed separately in each of the transistor region and the light-receiving region.

Then, the substrate resistance between a part of the substrate immediately under the light-receiving region and a part of the substrate immediately under the transistor region is increased, so that electric coupling between these parts is reduced. Accordingly, the potential variation in the collector region caused by amplification by the bipolar transistor is less likely to affect the photodetector via parasitic capacitance between the substrate and the buried region of the second conductivity type, thus suppressing entering of a signal from the bipolar transistor into the photodetector.

In the second semiconductor photodetector device, the distance between the second semiconductor layer in the transistor region and the second semiconductor layer in the light-receiving region is preferably set at least 10 μm.

Then, inductive coupling between the bipolar transistor and the photodetector is reduced, so that entering of an alternating current signal amplified by the bipolar transistor into the photodetector is suppressed, and thus deterioration of the S/N ratio resulting due to entering of the signal is also suppressed.

A third semiconductor photodetector device according to the present invention achieves the second object and includes: a first semiconductor layer of a first conductivity type formed on a semiconductor substrate of the first conductivity type; and a second semiconductor layer of a second conductivity type formed on the first semiconductor layer and having a light-receiving region, wherein the first semiconductor layer includes a first region of the first conductivity type and a second region of the first conductivity type formed on the first region and containing an impurity at a concentration lower than that of the first region, and the second semiconductor layer includes a third region containing an impurity of the second conductivity type at a concentration equal to or higher than that of the second region and a fourth region of the second conductivity type formed in the third region and containing an impurity at a concentration higher than that of the third region.

In the third semiconductor photodetector device according to the present invention, the impurity concentration of the third region of the second conductivity type is set equal to or higher than that of the second region of the first conductivity type, so that a depletion layer formed in the second region is extended to the third region without suppressing extension thereof. Accordingly, capacitance is reduced as compared to the conventional examples, and frequency characteristics are improved. In addition, in the second semiconductor layer of the second conductivity type having the third and fourth regions and constituting the light-receiving region of a photodetector, the fourth region is formed in the third region and has an impurity concentration higher than that of the third region, so that the frat portion (represented by the symbol d in FIG. 11B) of the potential formed in the third region is shortened, and thus frequency characteristics in the third region are improved. Accordingly, in the third semiconductor photodetector device according to the present invention, the structure including the third region and the forth region formed in the third region allows the thickness of the third region to be increased. As a result, a vertical pnp-transistor (VPNP-Tr) is formed without deterioration of characteristics of the photodetector.

In the third semiconductor photodetector device, the impurity concentration of the fourth region preferably has a peak at a depth of 0.3 μm to 0.7 μm, both inclusive, from an upper face of the third region.

In the third semiconductor photodetector device, the fourth region is preferably formed in the range from 0.3 μm to 0.7 μm, both inclusive, from an upper face of the third region.

In the third semiconductor photodetector device, the impurity concentration of the fourth region preferably has a peak value equal to or higher than $10^3$ times that of the third region.

In the third semiconductor photodetector device, wherein the third region preferably has an impurity concentration equal to or higher than that of the second region and equal to or lower than 10 times that of the second region.

In the third semiconductor photodetector device, the second semiconductor layer preferably has a fifth region of the second conductivity type formed in a peripheral part of the light-receiving region to be connected to the fourth region and having an impurity concentration higher than that of the third region.

In the third semiconductor photodetector device, the first region preferably has an impurity concentration equal to or higher than $10^3$ times that of the semiconductor substrate.

In the third semiconductor photodetector device preferably further includes a transistor region defined in the second semiconductor layer by an isolation insulating layer extending from a surface of the second semiconductor layer to the first semiconductor layer.

In this case, the transistor region preferably includes; an isolation region formed in an upper part of the second region and containing an impurity of the first conductivity type; a collector region of the first conductivity type located on the isolation region and formed in the third region; a base region of the second conductivity type formed in an upper part of the collector region; and an emitter region of the first conductivity type formed in the base region.

BRIEF DESCRIPTION OF THE DRAWINGS

FIG. 5A is a graph showing a profile of impurity concentrations in semiconductor regions and FIG. 5B is an energy band diagram in the semiconductor regions.

FIG. 9A is a graph showing a profile of impurity concentrations in semiconductor regions and FIG. 9B is an energy band diagram in the semiconductor regions.

FIG. 11A is a graph showing a profile of impurity concentrations in semiconductor regions and FIG. 11B is an energy band diagram in the semiconductor regions.

DESCRIPTION OF THE PREFERRED EMBODIMENTS

Embodiment 1

A semiconductor photodetector device according to a first embodiment of the present invention will be described with reference to drawings.

Figure 1:
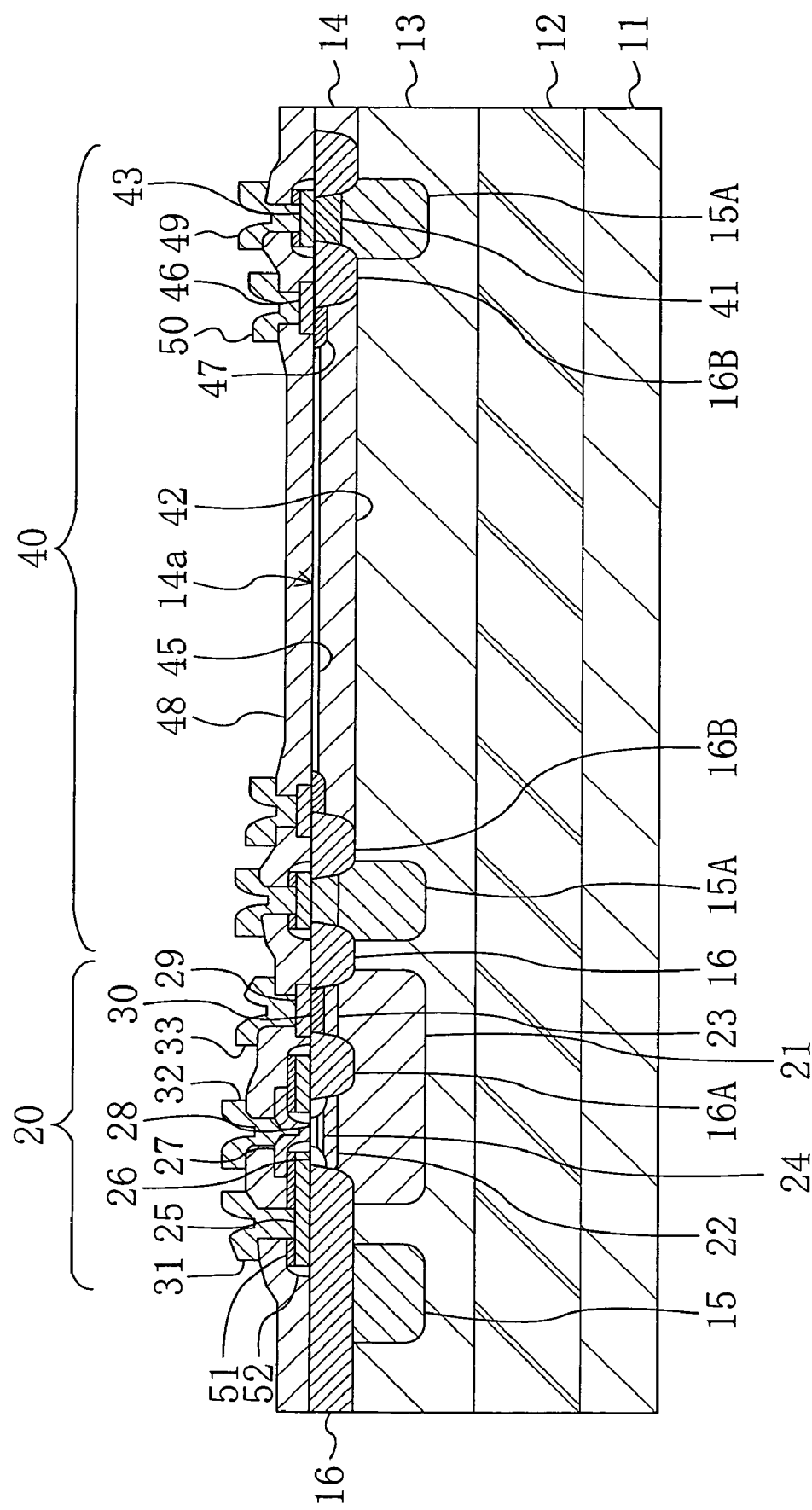
FIG. 1 is a cross-sectional view showing a structure of a semiconductor photodetector device according to a first embodiment of the present invention.

FIG. 1 shows a cross-sectional structure of the semiconductor photodetector device of the first embodiment. As shown in FIG. 1, a first p-type semiconductor layer (a first region of a first semiconductor layer) 12 containing a p-type impurity at a high concentration, a second p-type semiconductor layer (a second region of the first semiconductor layer) 13 containing an n-type impurity at a concentration lower than that of the first p-type semiconductor layer 12 and an n-type semiconductor layer (a second semiconductor layer) 14 containing an n-type impurity at a concentration higher than that of the second p-type semiconductor layer 13 are formed in this order over a substrate 11 made of p-type silicon. Over the substrate 11, a region where an npn-bipolar transistor 20 is formed and a region where a photodiode 40 of a cathode common type is formed are defined by isolation regions 15 and 15A formed by selectively diffusing an impurity with a high concentration in the second p-type semiconductor layer 13 and an isolation insulating film 16 selectively formed and extending from the upper face of the n-type semiconductor layer 14.

The second p-type semiconductor layer 13 is epitaxially grown on the substrate 11 to a thickness of about 11 μm and has a p-type impurity concentration of about $1 \times 10^{14}$ cm$^{-3}$. The n-type semiconductor layer 14 is epitaxially grown on the second p-type semiconductor layer 13 to a thickness of about 1 μm and has an n-type impurity concentration of about $7 \times 10^{15}$ cm$^{-3}$.

The first p-type semiconductor layer 12 is a buried region formed between the substrate 11 and the second p-type semiconductor layer 13 in the entire region and has a concentration of about $1 \times 10^{18}$ cm$^{-3}$. The first p-type semiconductor layer 12 is formed to have a width of about 5 μm for distribution from the upper face of the substrate 11 to the second p-type semiconductor layer 13. Therefore, the remaining part of the second p-type semiconductor layer 13 (i.e., the distance from the upper face of the first p-type semiconductor layer 12 to the lower face of the n-type semiconductor layer 14) is about 6 μm.

In the region where the bipolar transistor 20 is formed, a collector-lower-part extraction region 21 serving as a high-concentration n-type buried region (a buried region of a second conductivity type) is provided between the second p-type semiconductor layer 13 and the n-type semiconductor layer 14. In a part of the n-type semiconductor layer 14 located above the collector-lower-part extraction region 21, an insulating film 16A similar to the isolation insulating film 16 is selectively formed, so that the part of the n-type semiconductor layer 14 is divided into a collector region 22 and a collector extraction region 23.

In a part of the n-type semiconductor layer 14 located on the collector region 22, a base region 24 formed by selectively diffusing a p-type impurity, of a base contact region 26 formed by diffusion a p-type impurity with a high concentration in the edge of the base region 24 from a p-type polycrystalline semiconductor film 25, and an emitter region 28 formed by diffusion of an n-type impurity with a high concentration in a part of the base region 24 enclosed with the base contact region 26 from an n-type polycrystalline semiconductor film 27 are provided. A collector contact region 30 formed by diffusion of an n-type impurity with a high concentration from an n-type polycrystalline semiconductor film 29 is provided in a part of the n-type semiconductor layer 14 located on the collector extraction region 23.

In the region where the photodiode 40 is formed, an insulating film 16B similar to the isolation insulating film 16 is selectively formed in a part surrounded by the isolation region 15A so that an anode extraction region 41 and a cathode region (a third region) 42 are defined. The anode extraction region 41 is connected to the isolation region 15A by diffusing a p-type impurity in the n-type semiconductor layer 14. The isolation region 15A functions as a part of an anode. A region surrounded by the insulating film 16B in the upper face of the n-type semiconductor layer 14 acts as a light-receiving region 14a of the photodiode.

A p-type polycrystalline semiconductor film 43 to which a p-type impurity with a high concentration is introduced is formed in an upper part of the anode extraction region 41. A high-concentration cathode region (a fourth region) 45 is formed in an upper part of the n-type semiconductor layer 14 located on the cathode region 42. A cathode contact region 47 is formed in the edges of the cathode region 42 and the high-concentration cathode region 45 by diffusion of an n-type impurity with a high concentration from an n-type polycrystalline semiconductor film 46.

The high-concentration cathode region 45 has an n-type impurity concentration of about $1 \times 10^{19}$ cm$^{-3}$ and a depth of about 0.1 μm from the surface (i.e., the light-receiving face) of the n-type semiconductor layer 14.

An anti-reflection film 48 made of silicon oxide is formed on the high-concentration cathode region 45 in the region where the photodiode 40 is formed.

The anti-reflection film 48 has a plurality of contact holes for forming openings on the p-type polycrystalline semiconductor film 25 and the n-type polycrystalline semiconductor films 27 and 29 of the bipolar transistor 20 and on the p-type polycrystalline semiconductor film 43 and the n-type polycrystalline semiconductor film 46 of the photodiode 40. The anti-reflection film 48 functions as an insulating film for insulating an element body and an electrode from each other in each of the bipolar transistor 20 and the photodiode 40. Specifically, in the bipolar transistor 20, a base electrode 31 connected to the base contact region 26 via the p-type polycrystalline semiconductor film 25, an emitter electrode 32 connected to the emitter region 28 via the n-type polycrystalline semiconductor film 27 and a collector electrode 33 connected to the collector contact region 30 via the n-type polycrystalline semiconductor film 29 are formed through respective contact holes of the anti-reflection film 48. In the photodiode 40, an anode electrode 49 connected to an anode contact region 44 via the p-type polycrystalline semiconductor film 43 and a cathode electrode 50 connected to the cathode contact region 47 via the n-type polycrystalline semiconductor film 46 are formed through respective contact holes of the anti-reflection film 48.

Though not specifically described, an upper insulating film 51 and side walls 52 used as protective films in a fabrication process are provided on the p-type polycrystalline semiconductor film 25 and the p-type polycrystalline semiconductor film 43 in the bipolar transistor 20 and the photodiode 40. In particular, in the bipolar transistor 20, the emitter region 28 is self-aligned by using the side wall 52 as a mask.

In the semiconductor photodetector device with the above structure, the second p-type semiconductor layer 13 has a resistance higher than those of the first p-type semiconductor layer 12 and the n-type semiconductor layer 14. When a reverse bias voltage is applied across the anode electrode and the cathode electrode, a depletion region is formed between the first p-type semiconductor layer 12 and the cathode region 42, so that the entire region along the thickness direction of the second p-type semiconductor layer 13 contributes to generation of photoelectric current. The second p-type semiconductor layer 13 has a sufficient thickness, i.e., is thicker than the absorption edge of incident light. The light-receiving efficiency of the photodiode 40 is higher than that of the photodiode of the first conventional example.

In the semiconductor photodetector device of the first embodiment, the p-type impurity concentration of the first p-type semiconductor layer 12 is higher than that of the substrate 11. Accordingly, even if carriers are generated from incident light in the substrate 11, the carriers are absorbed in the first p-type semiconductor layer 12 and their diffusion movement is stopped, thus suppressing degradation of high-frequency characteristics of the photodiode.

In addition, in the semiconductor photodetector device of the first embodiment, one depletion layer formed above the first p-type semiconductor layer 12 is used as a region contributing generation of photoelectric current. Accordingly, as compared to the photodiode of the second conventional example using two depletion layers formed above and below the cathode region, parasitic capacitance is reduced and high-frequency characteristics of the photodiode 40 are improved.

Furthermore, in the semiconductor photodetector device of the first embodiment, the n-type semiconductor layer 14 is formed to have a high impurity concentration, the n-type semiconductor layer 14 is not only used as the cathode region 42 of the photodiode 40 but also used as the collector region 22 of the bipolar transistor 20. Accordingly, the collector region 22, the base region 24 and the emitter region 28 are provided in the n-type semiconductor layer 14 with a thickness of about 1 μm and are electrically insulated at their sides by the isolation insulating film 16 and the insulating film 16A similar to the isolation insulating film 16. As a result, the bipolar transistor 20 operates at higher speed than those of the first and second conventional examples.

Moreover, in the semiconductor photodetector device of the first embodiment, the high-concentration cathode region 45 is provided on the cathode region 42, so that an internal electric field is generated between the cathode region 42 and the high-concentration cathode region 45 based on the concentration gradient of the n-type impurity. Accordingly, out of carriers generated from incident light, part of the carriers generated near a portion at a depth of 0.2 μm from the light-receiving face is taken in photoelectric current by utilizing the internal electric field between the cathode region 42 and the high-concentration cathode region 45, so that a region contributing generation of photoelectric current is formed in addition to the depletion layer formed in the second p-type semiconductor layer 13. As a result, the light sensitivity is enhanced. In particular, the light sensitivity to incident light with a short wavelength (specifically, blue light) is enhanced.

Hereinafter, modified examples of the semiconductor photodetector device of the first embodiment will be described with reference to drawings.

Modified Example 1 of Embodiment 1

Figure 2:
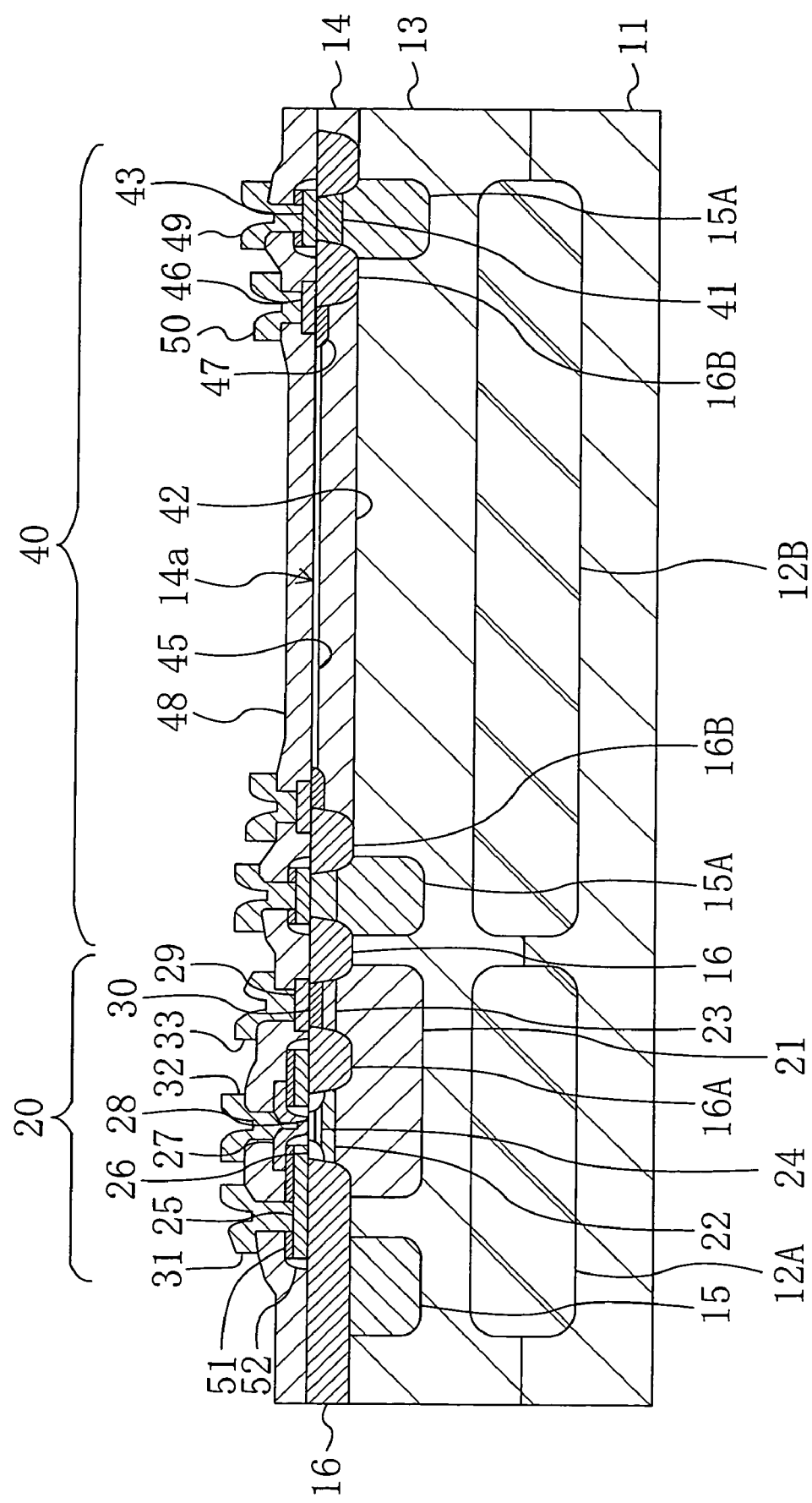
FIG. 2 is a cross-sectional view showing a structure of a semiconductor photodetector device according to a first modified example of the first embodiment.

FIG. 2 shows a cross-sectional structure of a semiconductor photodetector device according to a first modified example of the first embodiment. In FIG. 2, each member already shown in FIG. 1 is identified by the same reference numeral and the description thereof will be omitted herein.

As shown in FIG. 2, in the semiconductor photodetector device of the first modified example, instead of the first p-type semiconductor layer 12 shown in FIG. 1, p-type buried regions 12A and 12B are selectively formed in a transistor region where a bipolar transistor 20 is formed and a region where a photodiode 40 is formed, respectively.

In the OEIC device, the bipolar transistor 20 has a circuit configuration in which amplification is performed using a light signal received by the photodiode 40 as an input signal. Accordingly, the amplified signal with a large amplitude is superimposed onto a collector-lower-part extraction region 21, so that parasitic capacitance between the collector-lower-part extraction region 21 and a second p-type semiconductor layer 13 causes an alternating current signal to leak into the substrate and vary the substrate potential immediately under the collector-lower-part extraction region 21 and the second p-type semiconductor layer 13.

However, as shown in FIG. 2, the p-type buried region 12A and the p-type buried region 12B are selectively formed immediately under the bipolar transistor 20 the photodiode 40, respectively, so that the substrate resistance between these regions is increased so that electric coupling therebetween is reduced. Accordingly, an alternating current signal generated by amplification by the bipolar transistor 20 is less likely to enter the photodiode 40 through parasitic capacitance, so that it is possible to suppress entering of the signal from the bipolar transistor 20 into the photodiode 40.

In the semiconductor photodetector device of the first modified example, the p-type buried region 12A formed in the bipolar transistor 20 may be omitted.

Modified Example 2 of Embodiment 1

Figure 3:
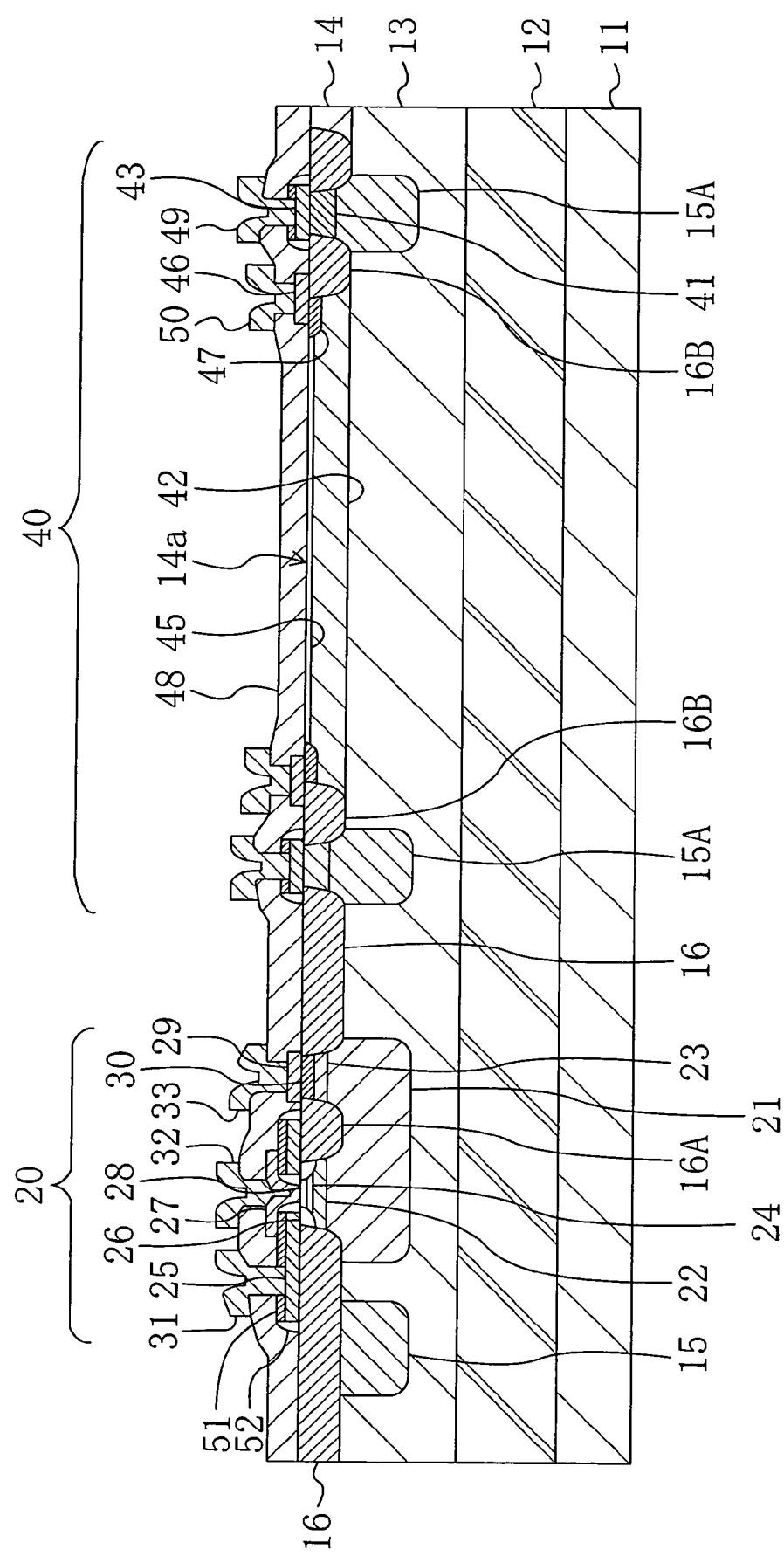
FIG. 3 is a cross-sectional view showing a structure of a semiconductor photodetector device according to a second modified example of the first embodiment.

FIG. 3 shows a cross-sectional structure of a semiconductor photodetector device according to a second modified example of the first embodiment. In FIG. 3, each member already shown in FIG. 1 is identified by the same reference numeral and the description thereof will be omitted herein.

As shown in FIG. 3, the semiconductor photodetector device of the second modified example is different from the device shown in FIG. 1 in that a bipolar transistor 20 and a photodiode 40 are placed at a given distance from each other and an isolation insulating film 16 has a large width. In this configuration of the second modified example, inductive coupling between the bipolar transistor 20 and the photodiode 40 is reduced, so that it is possible to suppress entering of an alternating current signal amplified by the bipolar transistor 20 into the photodiode. As a result, reduction of the S/N ratio resulting from entering of the signal is also suppressed. The given distance is a clearance of 10 µm or more. Increase of the clearance is effective because the inductive coupling is reduced accordingly. However, as the clearance increases, the integration degree of the OEIC device decreases. Therefore, the clearance is preferably in the range from 10 µm to 100 µm, both inclusive.

In the semiconductor photodetector devices of the first embodiment and the modified examples thereof, the impurity concentrations of the substrate 11 and the first p-type semiconductor layer 12 are not limited to the values described above, and it is sufficient that the impurity concentration of the first p-type semiconductor layer 12 is equal to or higher than $10^3$ times that of the substrate 11. Then, the first p-type semiconductor layer 12 ensures prevention of diffusion of carriers generated in the substrate 11, so that frequency characteristics do not deteriorate.

In the semiconductor photodetector devices of the first embodiment and the modified examples thereof, the impurity concentrations of the cathode region 42 and the high-concentration cathode region 45 are not limited to the values described above, and it is sufficient that the impurity concentration of the high-concentration cathode region 45 is equal to or higher than $10^2$ times that of the cathode region 42. Then, carriers generated from incident light are used as photoelectric current by utilizing an internal electric field between the cathode region 42 and the high-concentration cathode region 45, so that a region contributing light reception is enlarged and the light sensitivity is enhanced. The thickness of the high-concentration cathode region 45 is not limited to 0.1 µm. As long as the thickness of the high-concentration cathode region 45 is in the range from 0.01 µm to 0.15 µm, both inclusive, sufficient light sensitivity is obtained even with respect to blue incident light.

Embodiment 2

A second embodiment of the present invention will be described with reference to drawings.

Figure 4:
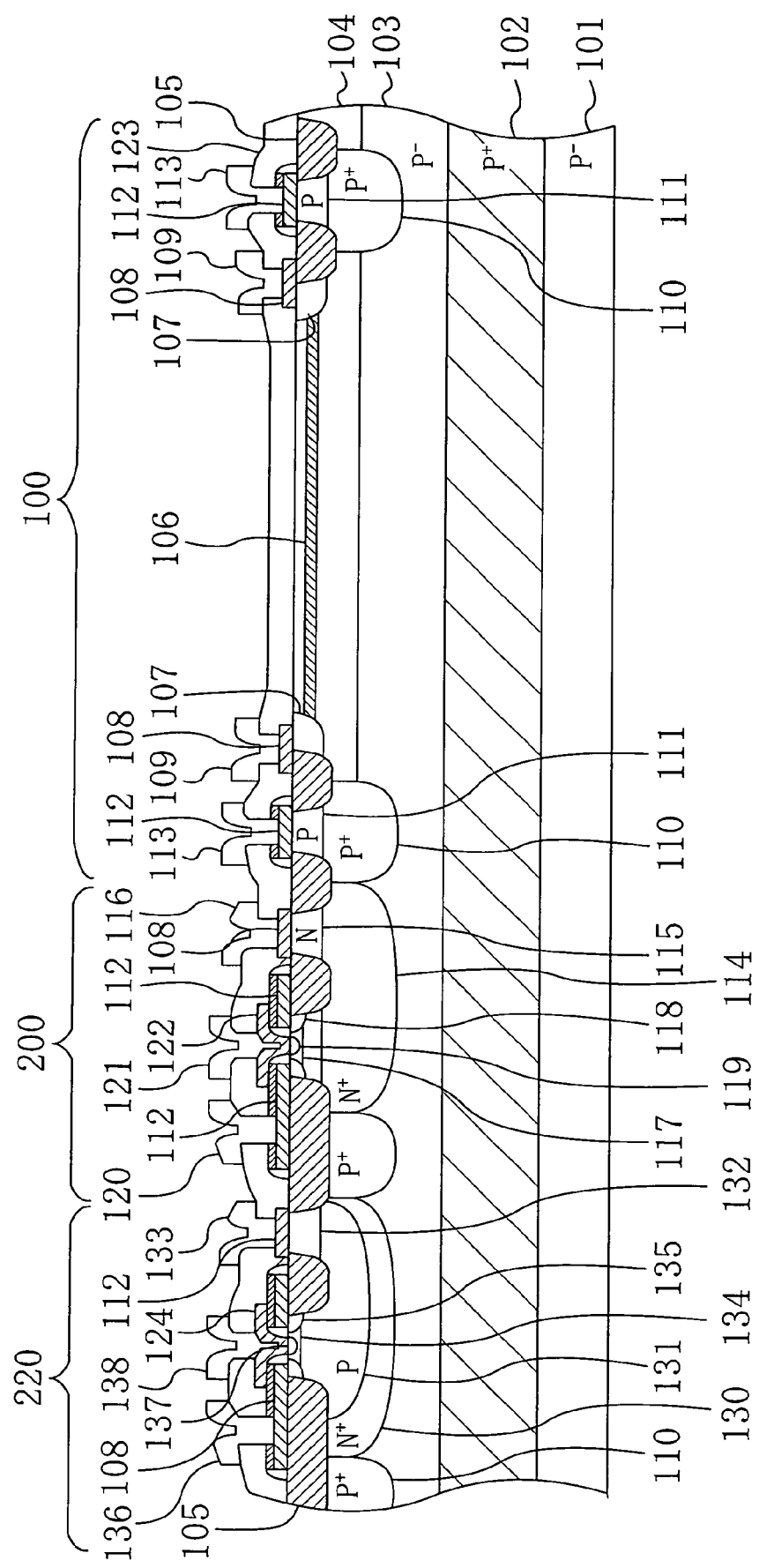
FIG. 4 is a cross-sectional view schematically showing a structure of a semiconductor photodetector device according to a second embodiment of the present invention.

FIG. 4 schematically shows a cross-sectional structure of an OEIC device which is an example of a semiconductor photodetector device according to the present invention and in which a photodiode, an npn-bipolar transistor and a vertical pnp-transistor are formed on a substrate.

As shown in FIG. 4, an $p^+$-type semiconductor region 102 of a high-concentration semiconductor layer with a thickness of about 10 µm and an impurity concentration of about $1\times10^{18}$ cm$^{-3}$ is formed by ion implantation in an upper part of a semiconductor substrate 101 made of p-type silicon (Si) and having a specific resistance of 100 Ωcm to 200 Ωm and a low impurity concentration. A $p^-$-type semiconductor region 103 with a thickness of about 5 µm and an impurity concentration lower than that of the $p^+$-type semiconductor region 102, e.g., about $1\times10^{14}$ cm$^{-3}$, and an n-type semiconductor region 104 with a thickness of about 2 µm and an impurity concentration of about $1\times10^{15}$ cm$^{-3}$ are epitaxially grown in this order on the $p^+$-type semiconductor region 102.

The principal surface of the epitaxial substrate thus formed is divided into a photodetector part 100, a first transistor part 200 and a second transistor part 220. An isolation insulating layer 105 made of silicon dioxide (SiO$_2$) is formed by local oxidation as so-called LOCOS to insulate the elements in the photodetector part 100, the first transistor part 200 and the second transistor part 220 from each other. A $p^+$-type buried region 110 to which an impurity is introduced at a high concentration is formed in a region located below the isolation insulating layer 105 and extending from the n-type semiconductor region 104 to an upper portion of the $p^-$-type semiconductor region 103. A protective insulating film 123 made of, for example, silicon oxide, is formed as a passivation film over the n-type semiconductor region 104 except for regions in which electrodes are formed.

A feature of the second embodiment is that a high-concentration n$^+$-type semiconductor region 106 with a thickness of about 0.3 μm and an impurity concentration of about 1×10$^{19}$ cm$^{-3}$ is selectively formed to a depth of, for example, 0.5 μm from the upper face of the n-type semiconductor region 104 in a part of the n-type semiconductor region 104 included in the photodetector part 100. The impurity concentration of the n$^+$-type semiconductor region 106 is not limited to the above value and is preferably higher than or equal to about 1×10$^{18}$ cm$^{-3}$.

A first polycrystalline semiconductor layer 108 to which an n-type impurity is introduced at a high concentration is formed on a part of the n-type semiconductor region 104 located in the periphery of the photodetector part 100, and an cathode contact layer 107 is formed by impurity diffusion from the first polycrystalline semiconductor layer 108. A cathode electrode 109 is formed on the first polycrystalline semiconductor layer 108.

The high-concentration p$^+$-type buried region 110 is formed in parts of the p$^-$-type semiconductor region 103 and the n-type semiconductor region 104 in the periphery of the photodetector part 100. A second polycrystalline semiconductor layer 112 to which a high-concentration p-type impurity is introduced is formed on a part of the n-type semiconductor region 104 located above the p$^+$-type buried region 110. A p-type anode contact layer 111 is formed in part of the n-type semiconductor region 104 by impurity diffusion from the second polycrystalline semiconductor layer 112. An anode electrode 113 is formed on the second polycrystalline semiconductor layer 112. In this manner, a photodiode is formed.

In a case where incident light is red laser light, if a light absorption of 95% or higher is required, the peak of the impurity concentration in the p$^+$-type semiconductor region 102 is at a depth of about 10 μm or more from the surface of the n-type semiconductor region 104. The total thickness of the p$^+$-type semiconductor region 102, the p$^-$-type semiconductor region 103 and the n-type semiconductor region 104 is set such that the amount of absorbed light during light reception is at least absorption length (the inverse of an absorption coefficient.)

With respect to the potential gradient that is used to prevent generation of photoelectric current due to diffusion movement of carriers generated from incident light in the semiconductor substrate 101 by utilizing the difference in impurity concentration between the semiconductor substrate 101 and the p$^+$-type semiconductor region 102, the concentration difference is three orders of magnitude or more, i.e., one is at least 1 times larger than the other.

The thickness of the n-type semiconductor region 104 is 2 μm or more so as to allow formation of a VPNP-Tr in the second transistor part. The impurity concentration of the n-type semiconductor region 104 is higher than or equal to that of the p$^-$-type semiconductor region 103 and less than or equal to ten times that of the p$^-$-type semiconductor region 103 so as to form a depletion layer in the p$^-$-type semiconductor region 103 as intended.

As described above, the peak concentration of the impurity in the n$^+$-type semiconductor region 106 forms a concentration gradient greater than or equal to three orders of magnitude of, i.e., at least 10$^3$ times greater than, that of the n-type semiconductor region 104. This concentration gradient forms a potential gradient in the n-type semiconductor region 104, and the potential gradient is used to set the concentration at a value at which the speed of carrier movement increases. The peak of the impurity concentration in the semiconductor region 106 is at a depth of 0.3 μm to 0.7 μm, both inclusive, from the upper face of the n-type semiconductor region 104, and more preferably less than or equal to 0.4 μm.

The width of the concentration profile of the semiconductor region 106 is in the range from 0.3 μm to 0.7 μm, both inclusive. More preferably, the width (thickness) of a half of the concentration profile from the concentration peak to the impurity concentration of the n-type semiconductor region 104 is 0.15 μm or less.

Now, the first transistor part 200 and the second transistor part 220 will be described.

First, the first transistor part 200 is an npn-bipolar transistor and is constituted by an n-type collector part, a p-type base part and an n-type emitter part.

The n-type collector part is surrounded by the p$^+$-type buried region 110 serving as an isolation in the first transistor part 200 and is constituted by: an n-type buried collector region 114 with a high-impurity concentration; the n-type first polycrystalline semiconductor layer 108 selectively formed above the n-type buried collector region 114; an n-type collector contact region 115 formed by impurity diffusion from the first polycrystalline semiconductor layer 108; and a collector electrode 116 formed on the first polycrystalline semiconductor layer 108.

The p-type base part is constituted by: a p-type active base region 117 located above the n-type buried collector region 114 and selectively formed in an upper part of the n-type semiconductor region 104; the p-type second polycrystalline semiconductor layer 112 which is located on the n-type semiconductor region 104 and formed on the periphery of the p-type active base region 117 and to which a p-type impurity is introduced at a high concentration; a p-type base contact region 118 formed in an upper part of the n-type semiconductor region 104 by impurity diffusion from the second polycrystalline semiconductor layer 112; and a base electrode 120 formed on the second polycrystalline semiconductor layer 112.

The n-type emitter part is constituted by: an n-type third polycrystalline semiconductor layer 122 formed on the p-type active base region 117 by introducing an n-type impurity at a high concentration; an n-type emitter region 119 formed in the p-type active base region 117 by impurity diffusion from the n-type third polycrystalline semiconductor layer 122; and an emitter electrode 121 formed on the third polycrystalline semiconductor layer 122.

The second transistor part 220 is a vertical pnp-bipolar transistor (VPNP-Tr) and is constituted by a p-type collector part, an n-type base part and a p-type emitter part.

The p-type collector part is constituted by: an n$^+$-type buried layer 130 that is surrounded by the p$^+$-type buried region 110 serving as an isolation in the second transistor part 220 and has a high impurity concentration; a p-type buried collector region 131 formed in the n$^+$-type buried layer 130; the p-type second polycrystalline semiconductor layer 112 selectively formed above the p-type buried collector region 131; a p-type collector contact region 132 formed in an upper part of the n-type semiconductor region 104 by impurity diffusion from the second polycrystalline semiconductor layer 112; and a collector electrode 133 formed on the second polycrystalline semiconductor layer 112. As described above, in the second embodiment, the p-type buried collector region 131 needs to have a thickness of 2 μm or more so as to form the p-type buried collector region 131 as intended.

The n-type base part is constituted by: an n-type active base region 134 selectively formed in the p-type buried collector region 131; an n-type first polycrystalline semiconductor layer 108 formed on the n-type semiconductor region 104 and on the periphery of the n-type active base region 134; an n-type base contact region 135 formed in an upper part of the n-type semiconductor region 104 by impurity diffusion from the first polycrystalline semiconductor layer 108; and a base electrode 136 formed on the first polycrystalline semiconductor layer 108.

The p-type emitter part is constituted by: a p-type fourth polycrystalline semiconductor layer 124 formed on the n-type active base region 134 by introducing a p-type impurity at a high concentration; a p-type emitter region 137 formed in the n-type active base region 134 by impurity diffusion from the fourth polycrystalline semiconductor layer 124; and an emitter electrode 138 formed on the fourth polycrystalline semiconductor layer 124.

Hereinafter, operation of the semiconductor photodetector device of the second embodiment having the above structure will be described with reference to FIGS. 5A and 5B.

Figure 5A:
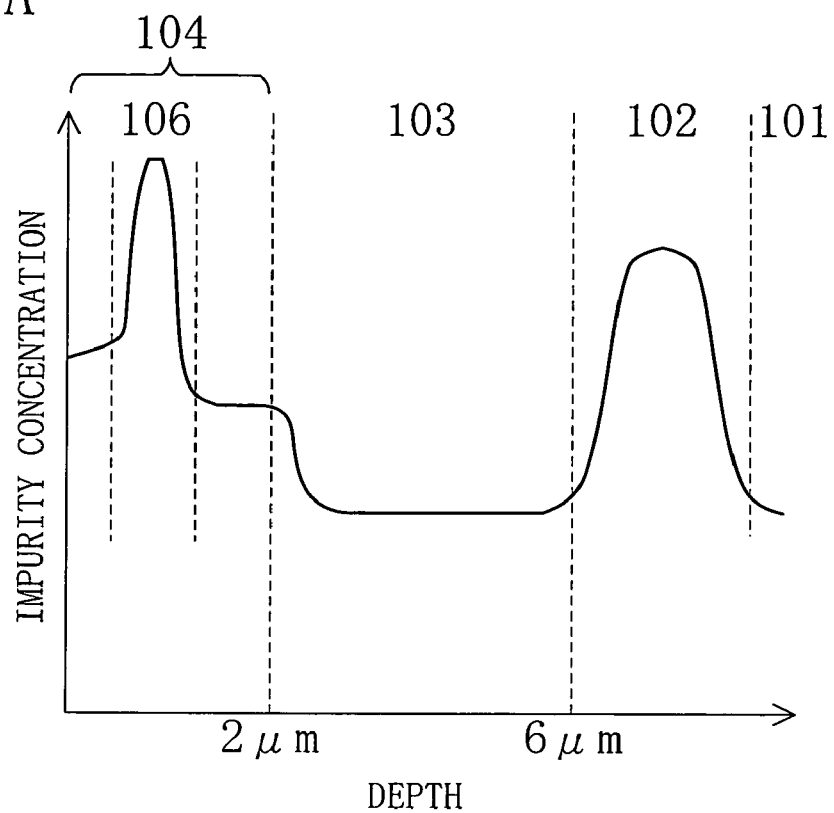
FIGS. 5A and 5B show material properties of the semiconductor photodetector device of the second embodiment.

In the second embodiment, in the photodetector part 100, as shown in FIG. 5A, the thickness of the n-type semiconductor region 104 is set to a value enough to form a VPNP-Tr in the second transistor part 220. In addition, the $n^+$-type semiconductor region 106 whose impurity concentration is higher than or equal to that of the n-type semiconductor region 104 by three orders of magnitude (i.e., at least $10^3$ times that of the n-type semiconductor region 104) is formed so as to have its concentration peak at a depth of 0.3 µm to 0.7 µm, both inclusive, from the upper face of the n-type semiconductor region 104. In this manner, as shown in FIG. 5B, the flat portion is shortened to be a portion f in the potential of electrons generated in a lower part of the n-type semiconductor region 104, so that frequency characteristics in the n-type semiconductor region 104 are improved.

Figure 5B:
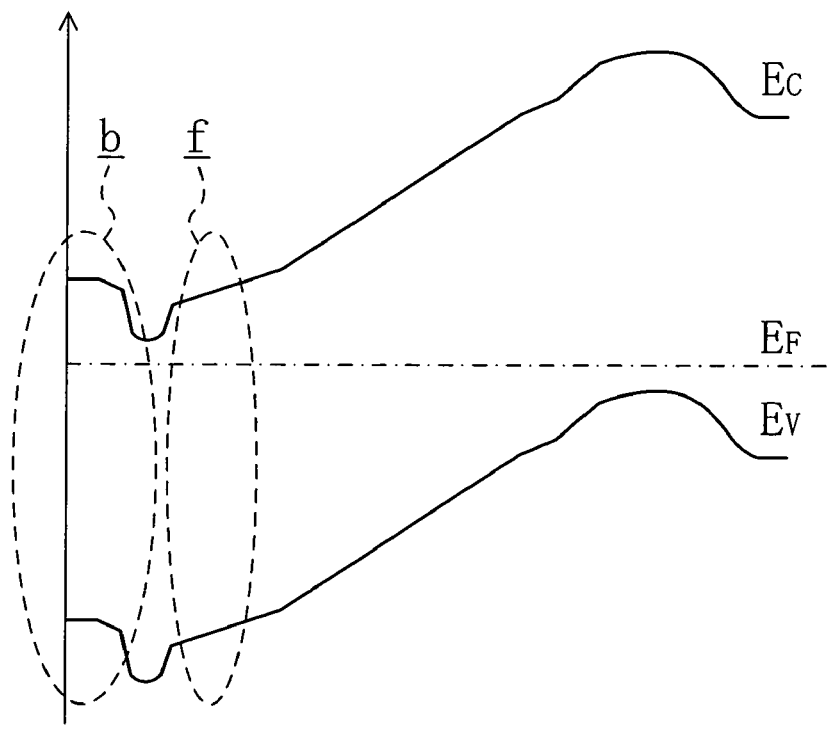
Figure 6:
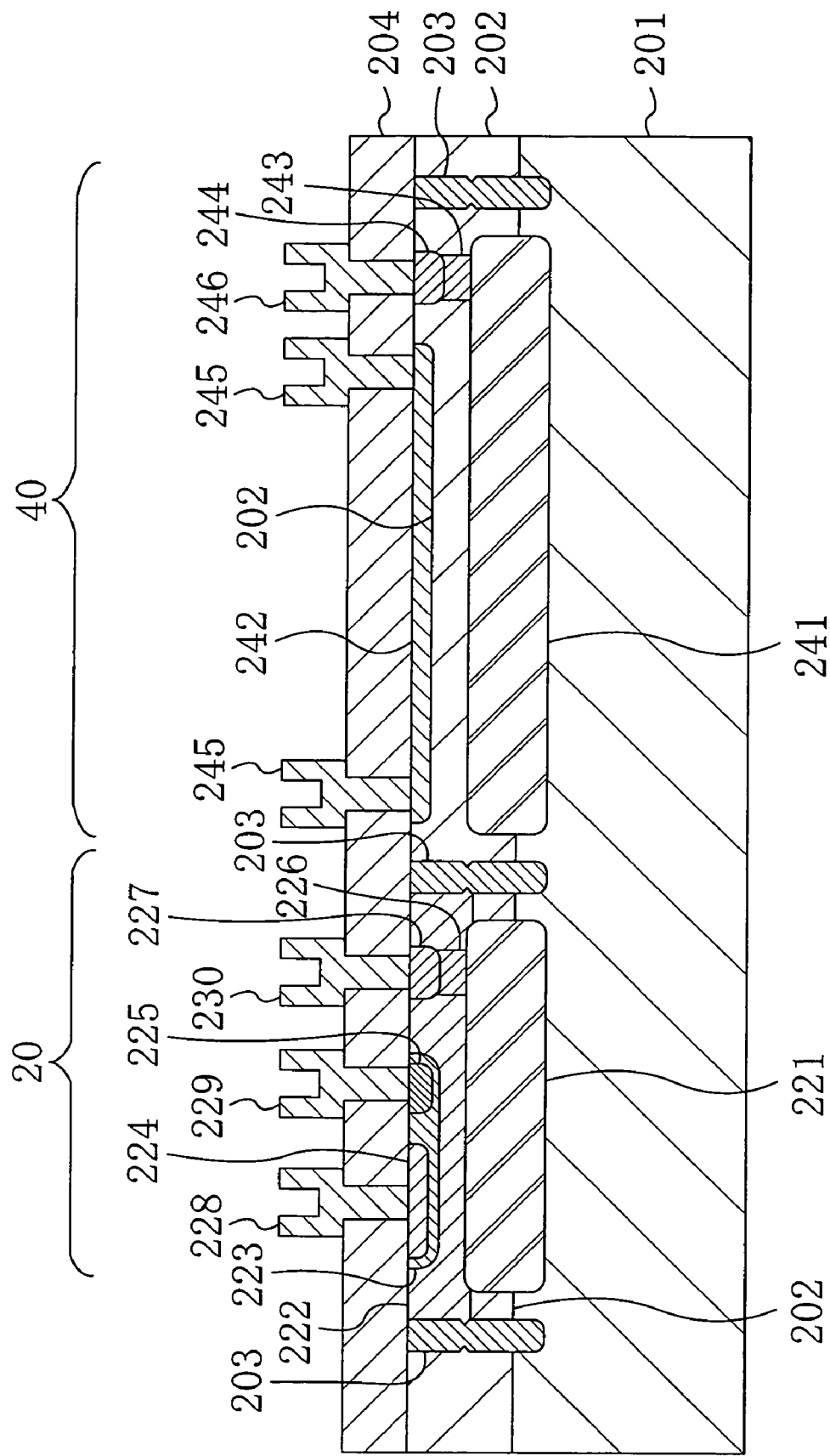
FIG. 6 is a cross-sectional view showing a structure of an OEIC device according to a first conventional example.
Figure 7:
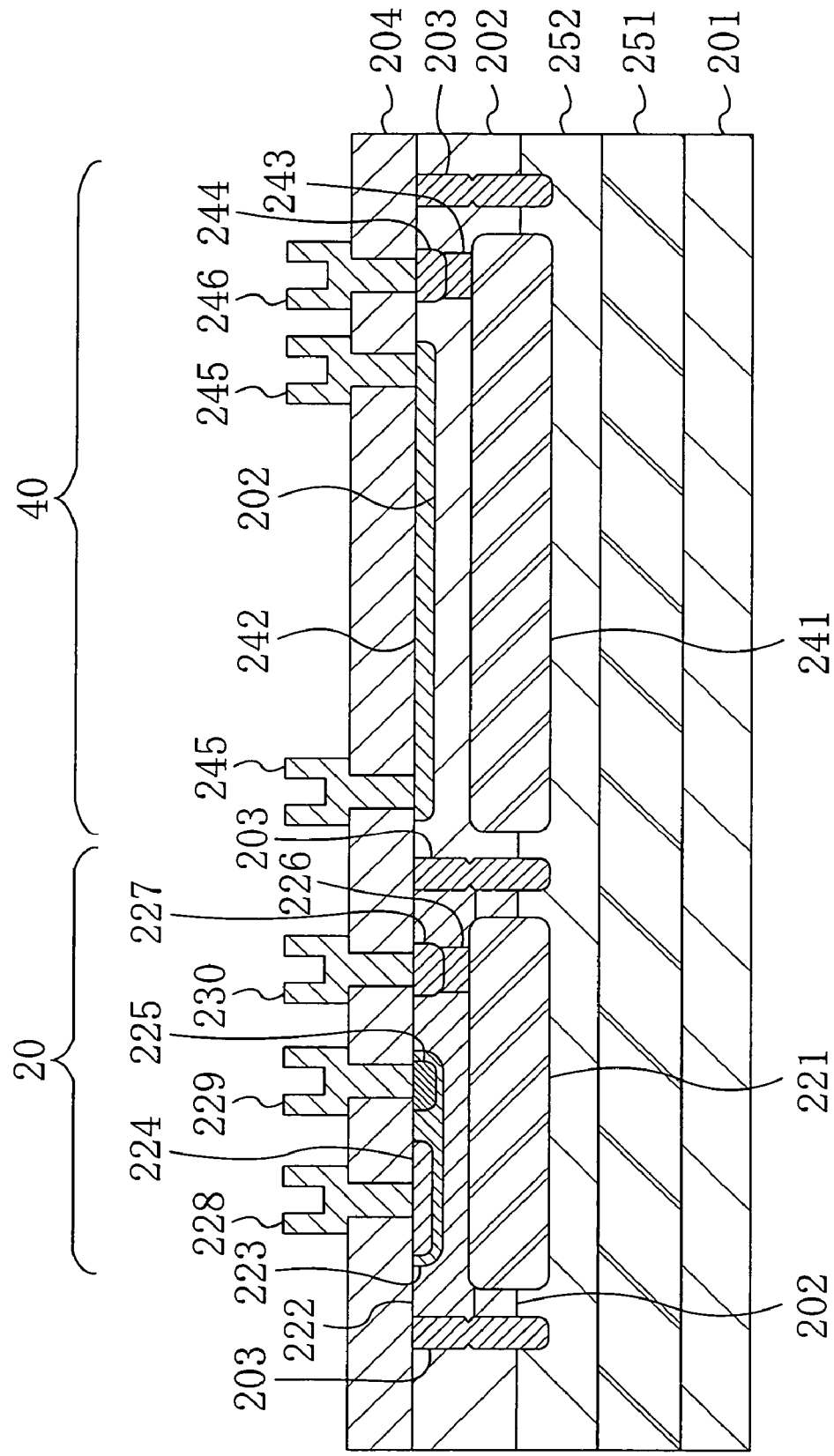
FIG. 7 is a cross-sectional view showing a structure of an OEIC device according to a second conventional example.

In addition, as shown in FIGS. 5A and 5B, the impurity concentration in a surface region b in the light-receiving part of the n-type semiconductor region 104 decreases, so that recombination of carriers near the surface of the n-type semiconductor region 104 is suppressed. As a result, light sensitivity is also improved.

Accordingly, in the semiconductor photodetector device of the second embodiment, in the n-type semiconductor region 104 receiving incident light, the $n^+$-type semiconductor region 106 with an impurity concentration higher than that of the n-type semiconductor region 104 is formed, so that it is possible to make the n-type semiconductor region 104 thick. This enables formation of a VPNP-Tr without deterioration of operation characteristics (i.e., light sensitivity and high-speed response) of the photodetector.

Figure 8:
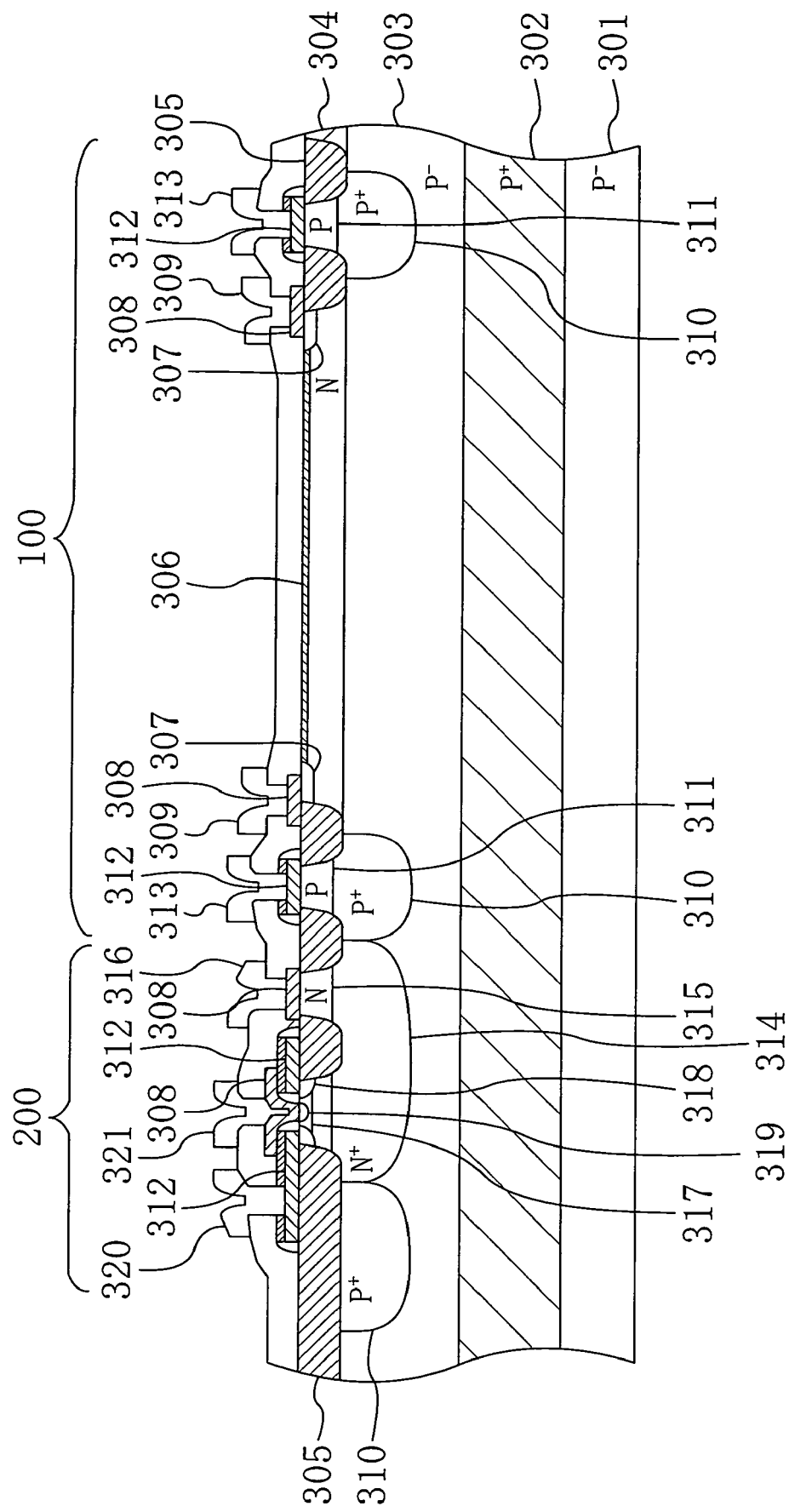
FIG. 8 is a cross-sectional view schematically showing a structure of a semiconductor photodetector device according to a third conventional example.
Figure 9A:
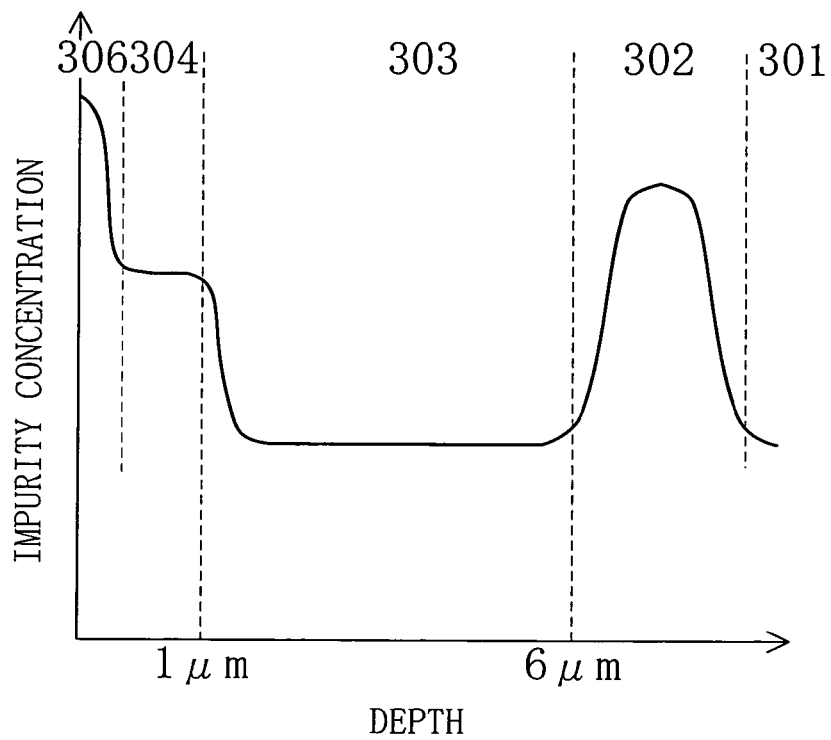
FIGS. 9A and 9B show material properties of the semiconductor photodetector device of the third conventional example.
Figure 9B:
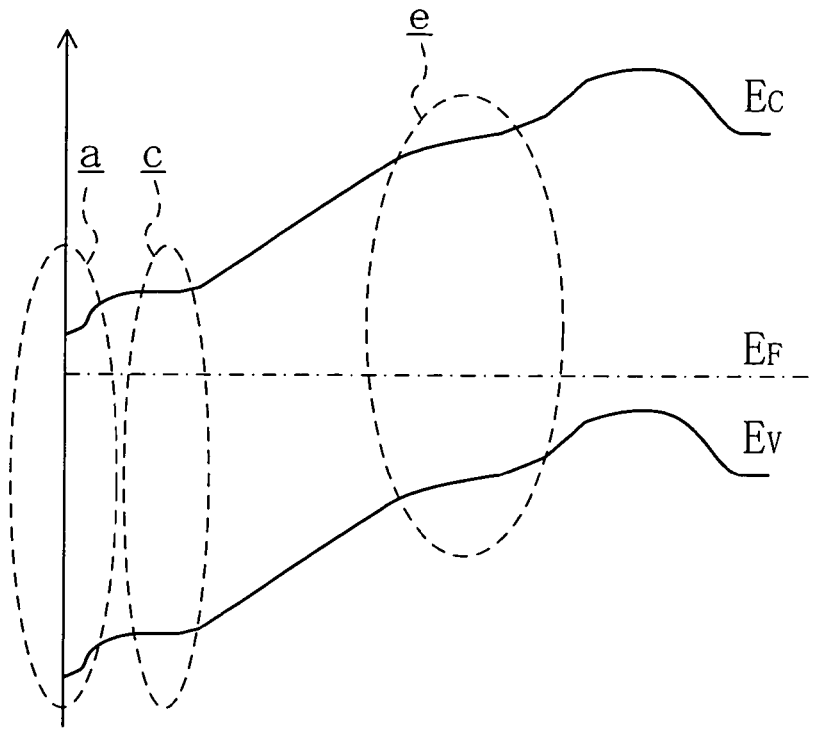
Figure 10:
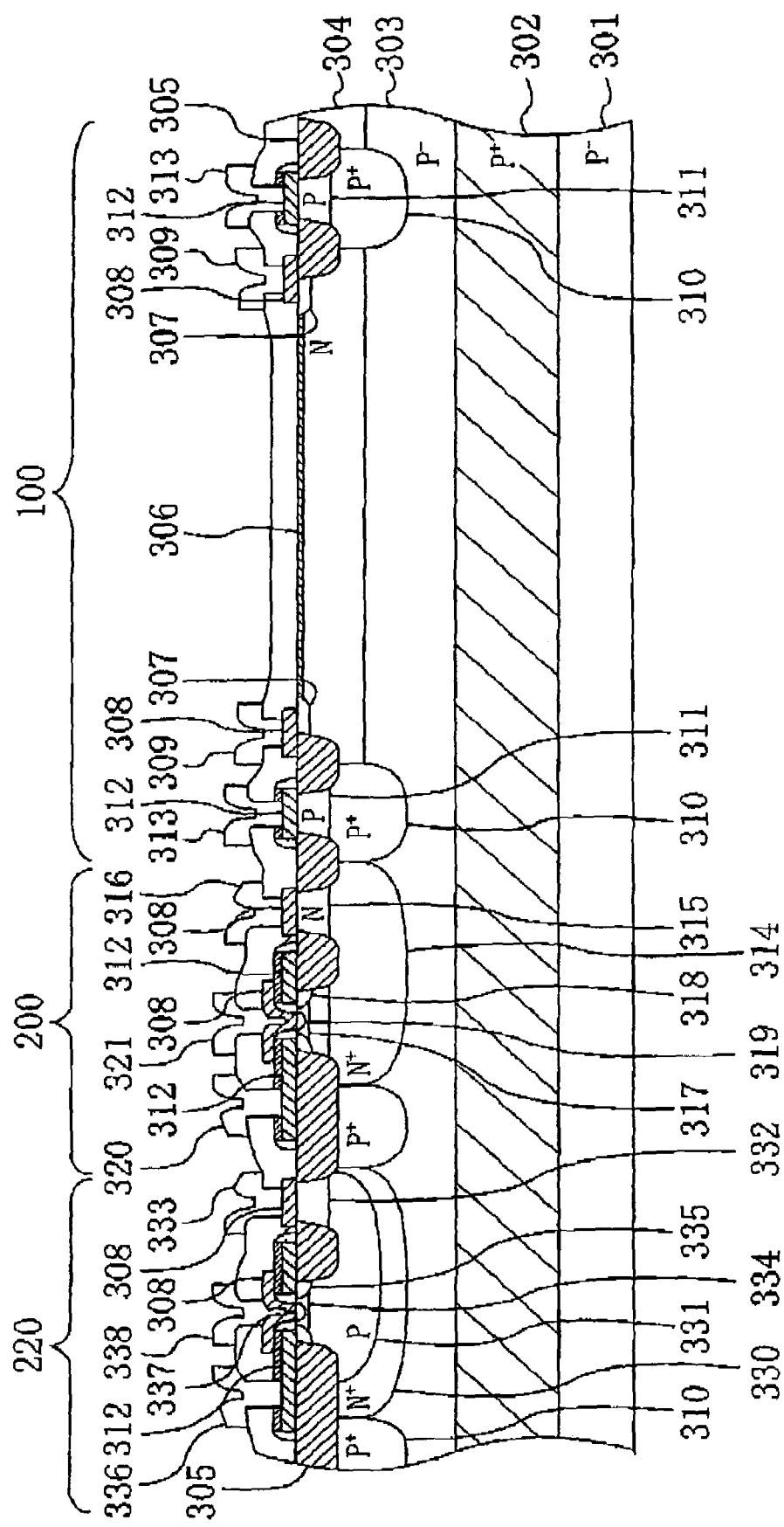
FIG. 10 is a cross-sectional view schematically showing a structure of a semiconductor photodetector device according to a reference example.
Figure 11A:
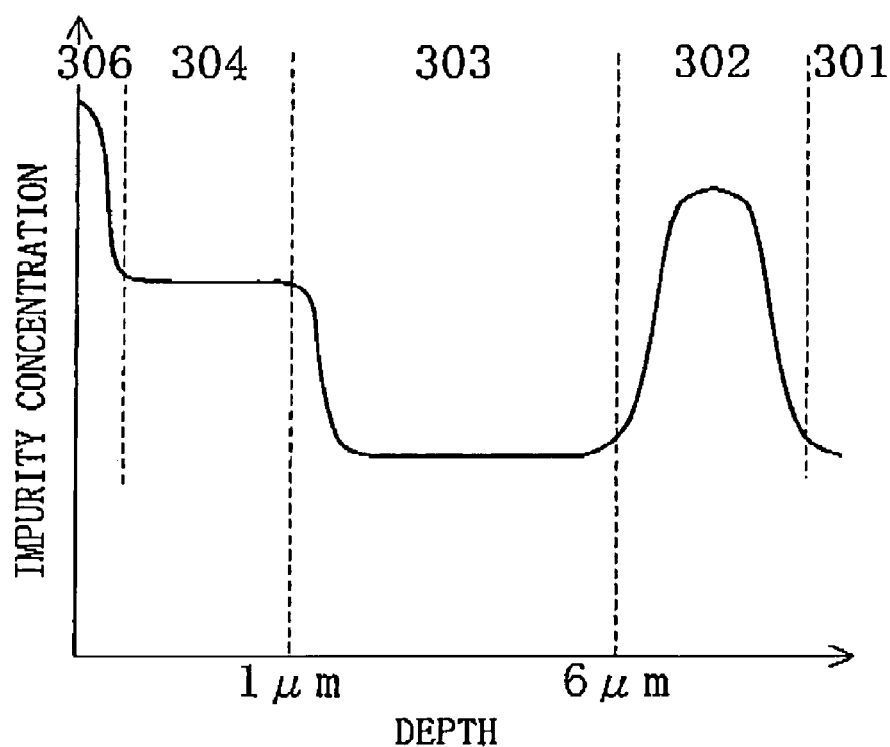
FIGS. 11A and 11B show material properties of the semiconductor photodetector device of the reference example.
Figure 11B:
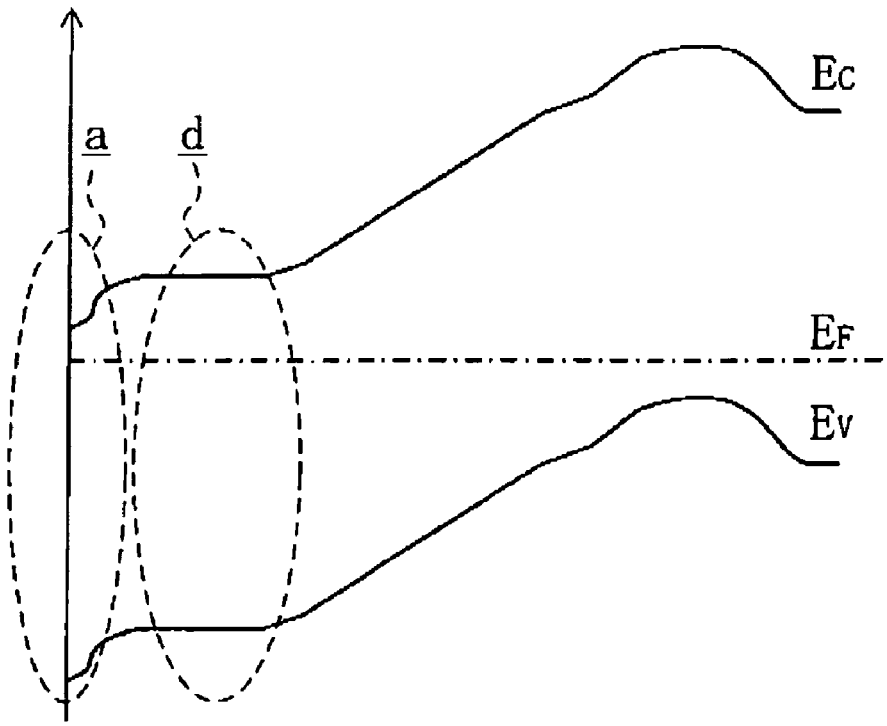

In the semiconductor photodetector device of the conventional example, as shown in FIG. 8, photoelectric current generated from light incident on the light-receiving region is drawn from the $p^+$-type buried region 310 to the surface of the n-type semiconductor region 304 by way of the $p^-$-type semiconductor region 303. At this time, a series resistance region e with a high resistance is formed by a low-impurity-concentration layer in the $p^-$-type semiconductor region 303 located between the $p^+$-type buried region 310 and the $p^+$-type semiconductor region 302. As a result, frequency characteristics of the photodetector deteriorate.

On the other hand, in the second embodiment, it is possible to make the n-type semiconductor region 104 thick, so that light-receiving characteristic is determined by the concentration of a portion from the surface of the n-type semiconductor region 104 constituting the light-receiving region to a lower part of the $p^-$-type semiconductor region 103. Accordingly, it is possible to reduce the thickness of the $p^-$-type semiconductor region 103. Accordingly, the distance between the $p^+$-type buried region 110 and the $p^+$-type semiconductor region 102 is reduced, so that series resistance is reduced and frequency characteristics of the photodetector are enhanced. In addition, the series resistance is lower than that of the third conventional example, thus reducing the area of the $p^+$-type buried region 110 provided in the periphery of the light-receiving region. As a result, it is possible to reduce the area of the photodetector itself, thus reducing the chip area.

In this manner, in the second embodiment, a semiconductor photodetector device in which a photodetector exhibiting high response speed and high light sensitivity with respect to three types of light-source wavelengths, an NPN-Tr and a VPNP-Tr are mounted on one chip is implemented.

What is claimed is:

1. A semiconductor photodetector device comprising:
   a first semiconductor layer of a first conductivity type formed on a semiconductor substrate of the first conductivity type; and
   a second semiconductor layer of a second conductivity type formed on the first semiconductor layer and having a light-receiving region,
   wherein the first semiconductor layer includes a first region of the first conductivity type and a second region of the first conductivity type formed on the first region and containing an impurity at a concentration lower than that of the first region, and
   the second semiconductor layer includes in the light-receiving region, a third region containing an impurity of the second conductivity type at a concentration equal to or higher than that of the second region and a fourth region of the second conductivity type selectively formed in an internal space and below an upper surface of the third region and containing an impurity at a concentration higher than that of the third region.

2. The device of claim 1, wherein the impurity concentration of the fourth region has a peak at a depth of 0.3 µm to 0.7 µm, both inclusive, from an upper face of the third region.

3. The device of claim 1, wherein the fourth region is formed in the range from 0.3 µm to 0.7 µm, both inclusive, from an upper face of the third region.

4. The semiconductor photodetector device of claim 1, wherein the impurity concentration of the fourth region has a peak value equal to or higher than $10^3$ times that of the third region.

5. The device of claim 1, wherein the third region has an impurity concentration equal to or higher than that of the second region and equal to or lower 10 times that of the second region.

6. The device of claim 1, wherein the second semiconductor layer has a fifth region of the second conductivity type formed in a peripheral part of the light-receiving region to be connected to the fourth region and having an impurity concentration higher than that of the third region.

7. The device of claim 1, wherein the first region has an impurity concentration equal to or higher than $10^3$ times that of the semiconductor substrate.

8. The device of claim 1, further comprising a transistor region defined in the second semiconductor layer by an isolation insulating layer extending from a surface of the second semiconductor layer to the first semiconductor layer.

9. The device of claim 8, wherein the transistor region includes:
- an isolation region formed in an upper part of the second region and containing an impurity of the first conductivity type;
- a collector region of the first conductivity type located on the isolation region and formed in the third region;
- a base region of the second conductivity type formed in an upper part of the collector region; and
- an emitter region of the first conductivity type formed in the base region.

10. The device of claim 1, wherein
a surface region of the third region has an impurity of the second conductivity type at a concentration lower than that of the fourth region.

11. The device of claim 10, wherein
the surface region of the third region has an impurity of the second conductivity type at a concentration higher than that of a lower part of the third region located under the fourth region.

* * * * *